United States Patent
Cheong

(10) Patent No.: US 6,923,869 B2
(45) Date of Patent: Aug. 2, 2005

(54) DEVICE FOR DEPOSITION WITH CHAMBER CLEANER AND METHOD FOR CLEANING THE CHAMBER

(75) Inventor: Woo-Seock Cheong, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 173 days.

(21) Appl. No.: 10/241,353

(22) Filed: Sep. 11, 2002

(65) Prior Publication Data

US 2003/0098039 A1 May 29, 2003

(30) Foreign Application Priority Data

Nov. 29, 2001 (KR) ................................ 10-2001-0075117

(51) Int. Cl.⁷ ........................... C23C 16/00; B08B 9/02; B08B 9/04
(52) U.S. Cl. .................. 118/724; 118/715; 156/345.37
(58) Field of Search .................. 156/345.5, 345.37, 156/345.52; 118/715, 722, 724; 216/66; 134/1, 1.3, 21, 21.1, 21.11, 76, 116 R, 169 C; 34/266, 275, 92, 104, 189; 15/301, 303, 306.1, 309.2

(56) References Cited

U.S. PATENT DOCUMENTS

| | | | | |
|---|---|---|---|---|
| 3,862,397 | A | * | 1/1975 | Anderson et al. ........... 219/405 |
| 4,657,616 | A | * | 4/1987 | Benzing et al. ........ 156/345.43 |
| 5,303,671 | A | * | 4/1994 | Kondo et al. ............... 118/719 |
| 6,190,458 | B1 | * | 2/2001 | Harada ....................... 118/715 |
| 6,287,984 | B1 | * | 9/2001 | Horie ......................... 438/758 |
| 6,442,867 | B2 | * | 9/2002 | Pressnall et al. .............. 34/410 |
| 6,533,902 | B1 | * | 3/2003 | Miki et al. ............. 204/157.15 |
| 2003/0098039 | A1 | * | 5/2003 | Cheong ....................... 134/1.1 |

* cited by examiner

*Primary Examiner*—Jeffrie R. Lund
(74) *Attorney, Agent, or Firm*—Marshall, Gerstein & Borun LLP

(57) ABSTRACT

A chamber cleaner includes a cleaner, which is sealed, a connector passing through a side of the cleaner, lamp assembly connected to the connector and uniformly arranged in an inside surface of the cleaner, a heat-source assembled in the lamp assembly and an exhausting unit having an entrance passing through a portion of the outside of the connector exposed to the cleaner, and an exit passing through a portion of the inside of the connector, which is extended to the outside of the exposed portion or a predetermined length.

16 Claims, 5 Drawing Sheets

DEVICE FOR DEPOSITION WITH CHAMBER CLEANER AND METHOD FOR CLEANING THE CHAMBER

FIELD OF THE INVENTION

The present invention relates to a semiconductor device and, more particularly, to a chamber cleaner, a device for deposition within the chamber and a method for cleaning the chamber.

DESCRIPTION OF RELATED ART

Recently, in a semiconductor device manufacturing process, a selective epitaxial growth (SEG) method of silicon is usually used, especially, in a device separation process, a source/drain region and a metal plug filling, etc. The reason of usage of the SEG method is that, as a semiconductor device becomes more highly integrated, the size of such a device gets smaller and smaller. Accordingly, there exists a limit in processing stable process without deteriorating device characteristics when carrying out a usual deposition and etching process.

Meanwhile, a single wafer-type chemical vapor deposition (CVD) is usually used as a device for the SEG, which is a technique for depositing a silicon epitaxial layer, selectively. In accordance with a processing condition and a formation temperature, there are used two-types of devices. First is a low pressure chemical vapor deposition (LPCVD) and second is an ultra-high vacuum chemical vapor deposition (UHV-CVD).

The LPCVD device has wide processing margin and has excellent productivity for manufacturing an epitaxial wafer but, in the SEG processing, a temperature for obtaining an effective growth speed and selectivity is much too high—over 800° C.—resulting in a high thermal budget.

Also, in adapting an in-situ doping processing, which is an advantage of the SEG process, it is difficult to obtain an abrupt profile, so a new connection profile may not be realized.

Generally, an in-situ cleaning adapts a hydrogen bake process at a temperature of over 800° C. and the bake process is a factor in the thermal budget. Besides, the LPCVD method is carried out in a single wafer-type chamber, so it is difficult to obtain more than 6 W/H (wafer/hour) of productivity.

Next, the UHV-CVD device carries out a process in a relatively low temperature, but it is a difficult process and has a high device cost, so a process margin for the SEG is not so bit, thereby resulting in a low productivity. Also, there does not exist an adequate in-situ chamber cleaning method, so the device is difficult to maintain.

The above-mentioned LPCVD and the UHV-CVD devices are usually used in a single wafer-type chamber, but recently, there is provided a low pressure chemical vapor deposition (LPCVD) and a ultra-high vacuum chemical vapor deposition (UHV-CVD), which adapts a tube-type chamber. The tube-type LPCVD and UHV-CVD are able to process a plurality of wafers.

An important part of the SEG process is quality, productivity and a low thermal budget, but the LPCVD device is not good in a thermal budget aspect. The UHV-CVD is good in a quality and a thermal budget aspect, but when considering a productivity aspect, the tube-type UHV-CVD (T-UHV-CVD) device is better.

However, since the T-UHV-CVD device has no special in-situ cleaning method for silicon coating of a quartz tube, a wet cleaning process is carried out in ex-situ, resulting in an unnecessary waste of time and manpower.

Also, if the T-UHV-CVD device is moved just a little in re-setting the cleaned tube, a processing condition is largely differentiated. Therefore, the T-UHV-CVD devices have stability drawbacks, and therefore requires additional time to monitor the process. Thus, the T-UHV-CVD device, which is capable of carrying out an ex-situ cleaning, has a defect in processing stability, cost, and productivity.

SUMMARY OF THE INVENTION

Accordingly a device for deposition and a method of chamber cleaning is provided. According to the disclosed example, such a device is capable of improving, for example, processing stability, manufacturing costs, and productivity in ex-situ wet cleaning of a quartz tube.

In accordance with an aspect of the present invention, there is provided a chamber cleaner, comprising a cleaning means, which may be sealed, a connection means passing through a side of the cleaning means, a lamp assembly means connected to the connection means and uniformly arranged in an inside surface of the cleaning means, the lamp assembly means including a heat-source assembled in the lamp assembly means, and an exhausting means having an entrance passing through a portion of the outside of the connection means exposed to the cleaning means and an exit passing through a portion of the inside of the connection means and which is extended to the outside of the exposed portion.

In accordance with another aspect of the present invention, there is provided a device for deposition comprising a tube-type chamber in which a layer deposition is carried out, a loading chamber for loading a wafer into the tube-type chamber, and a cleaner for cleaning the tube-type chamber by loading to the tube-type chamber from the loading chamber.

In accordance with still another aspect of the present invention, there is provided a method for cleaning a chamber comprising the steps of: a) equipping a wafer and tube cleaner in a loading chamber; b) loading the wafer into a tube-type chamber vertically connected to the loading chamber; c) depositing a layer to the wafer; d) unloading the wafer; e) loading the tube-type cleaner into the tube-type chamber and injecting a cleaning gas; and f) cleaning the tube-type chamber using the tube-type cleaner.

BRIEF DESCRIPTION OF THE DRAWINGS

Other details and features of the disclosed examples will become apparent from the following description of the embodiments with reference to the accompanying drawings, in which.

DETAILED DESCRIPTION OF THE PREFERRED EMBODIMENTS

Hereinafter, a device for deposition with chamber cleaner and method for cleaning the chamber assembled according to the teachings of the present invention will be described in detail referring to the accompanying drawings.

A method for solving a chamber cleaning process by using a tube-type chamber cleaner, a tube-type deposition device equipping the cleaner and a tube-type deposition device using a chamber cleaner are disclosed herein.

Figure 1:
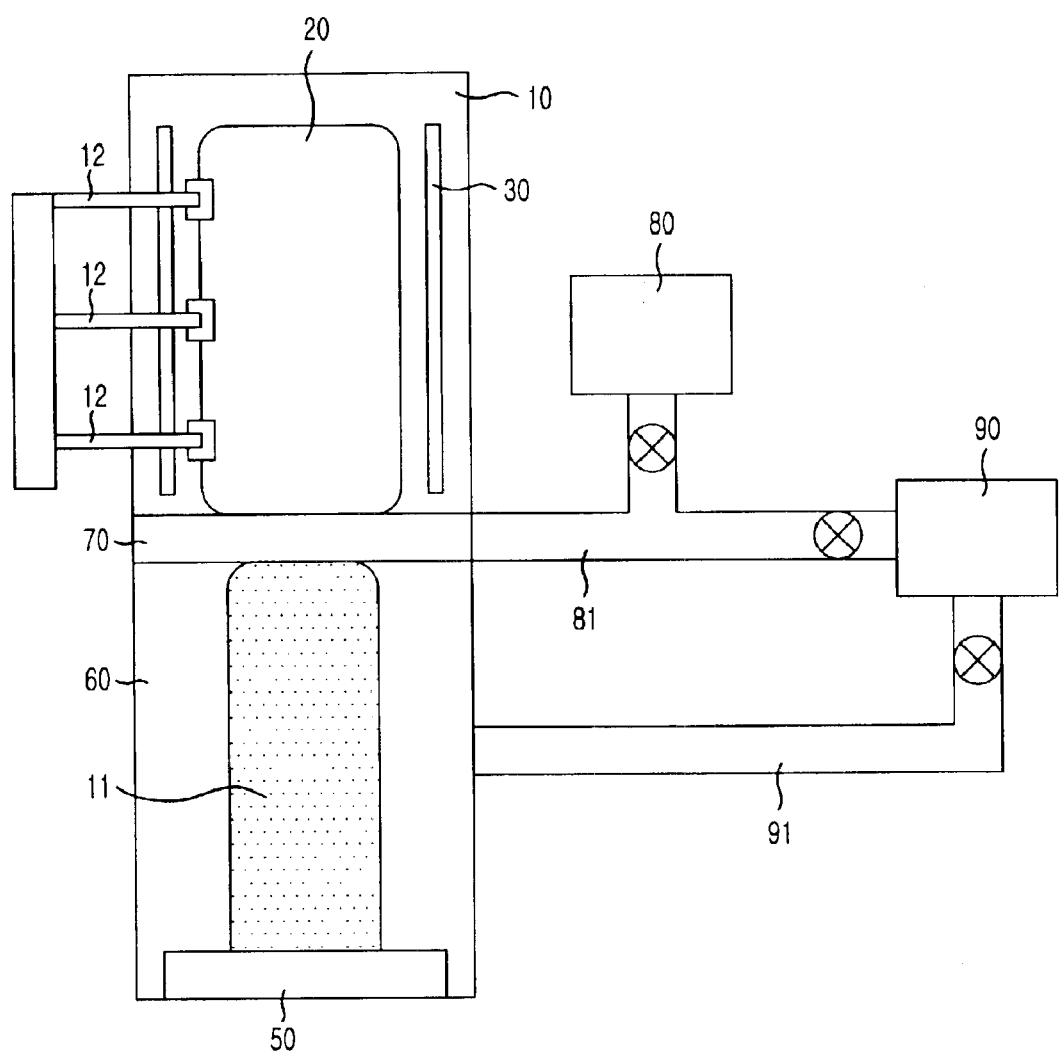
FIG. 1 is a front view illustrating an ultra high vacuum chemical vapor deposition (UHV-CVD) in accordance with the teachings of the present invention.

FIG. 1 is a front view illustrating a vertical-type ultra high vacuum chemical vapor deposition (UHV-CVD) in accordance with the teachings of the present invention.

Figure 2:
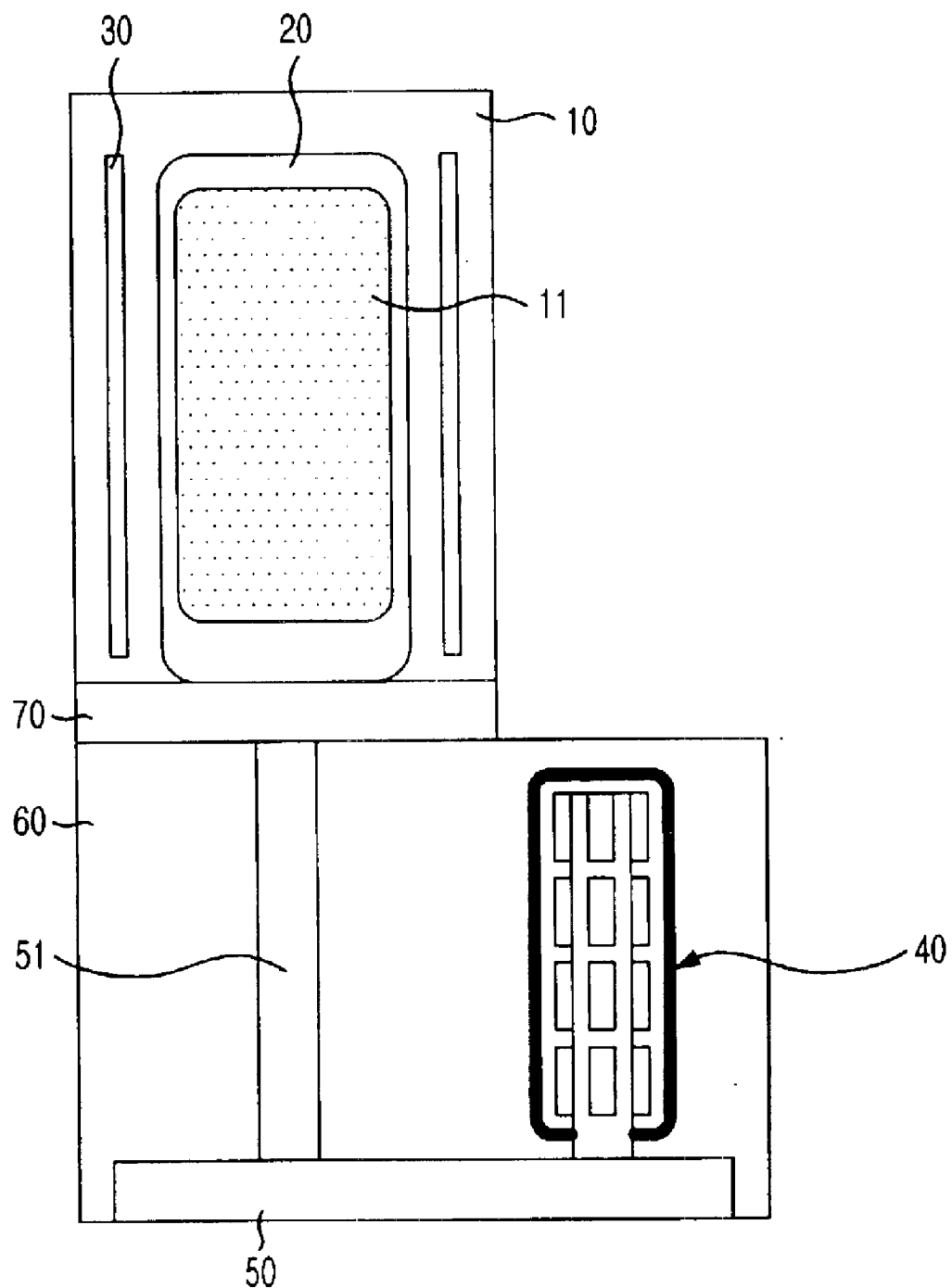
FIG. 2 is a side view showing an ultra high vacuum chemical vapor deposition (UHV-CVD) in accordance with the teachings of the present invention.

FIG. 2 is a side view illustrating an ultra high vacuum chemical vapor deposition (UHV-CVD) in FIG. 1. It shows post-loading a wafer.

Referring to FIGS. 1 and 2, the UHV-CVD in accordance with the teachings of the present invention includes a processing chamber 10, a quartz tube 20, which is provided within the processing chamber, and a wafer 11 is equipped, wherein in the wafer, there carries out a layer deposition.

A heater 30 is equipped in an inside wall of the processing chamber 10 and heats the quartz tube 20. A loading chamber 60 includes an elevator 50, which provides an elevating gear 51 to transmit a plurality of wafer 11 and a tube cleaner 40 into a quartz tube 20.

A door 70 is selectively opened and closed to load the wafer 11 and the tube cleaner 40 from the loading chamber 60 to the quartz tube 20.

A turbo molecular pump (TMP) 80 reduces a pressure of the quartz tube 20 within the processing chamber 10 to a deposition pressure needed in the UHV-CVD.

A rough pump 90 controls a processing pressure by connecting between the TMP 80 and the loading chamber 60 and exhausts a gas generated after cleaning the quartz tube 20.

In the quartz tube 20, there is a fixed gas injection line 12, which a reaction and a source gases are injected by opening the valve, and the valve is equipped in each line. The quartz tube 20 has a space and a size to process 25 to 100 wafers at one time, and the wafers 11 may be moved up and down a wafer equipping unit (not shown) inserted in each slot of the wafer 11 through the elevator 50 connected in a bottom portion.

Before forming a single crystal silicon layer, a deposition pressure (or a base pressure) is decreased to below 10-8 Torr using the large quantity of TMP 80 connected side or bottom part of the processing chamber, so that an in-situ vacuum cleaning process of a wafer can be carried out.

The rough pump 90 is connected to a side portion of the TMP 80 through an exhaust line. The rough pump 90 is connected to the loading chamber 60 through a foreline 91 to control a processing pressure, and the rough pump 90 exhausts a gas generated after cleaning the quartz tube 20 through the loading chamber 60.

The door 70 is disposed between the processing chamber 10 and the loading chamber 60. The door 70 is completely closed after loading the wafer 11, so as to thereby control a vacuum condition. In the disclosed example, the processing chamber 10 and the loading chamber 60 are vertically aligned and separate by the door 70.

Meanwhile, if the tube cleaner 40 is loaded, a bottom portion of the tube cleaner 40 and the door 70 are connected to be endured at a pressure of below 10-3 Torr. A flexible exhaust tube connected to the tube cleaner 40 itself exhausts a cleaning by-product gas from the quartz tube 20 to a rough pump 90.

A heater 30, such as an RF heater, is provided in the processing chamber 10 to heat a quartz tube 20 in depositing a layer and, when the heater 30 is being used, may raise the temperature of the quartz tube 20 to about 600° C. to 800° C., which is a deposition temperature of a single crystal silicon. Such an arrangement is advantageous in maintaining an equal temperature and an installation of such an arrangement is relatively easy.

A rotary pump and a piston rotary pump(s) are used as the rough pump 90, and the rough pump 90 is used as a forepump of a high vacuum pump. The rough pump 90 removes most of the air and then the TMP 80, which is not operated in an air condition, is operated at a pressure of 10-3 Torr.

Before carrying out a process, a base pressure may be reduced at below 10-8 Torr by using the TMP 80, and it is necessary to perform a wafer in-situ cleaning, such as a special in-situ vacuum cleaning before a wafer process. That is, before depositing a layer, such as a silicon layer, an unnecessary layer on a surface of a wafer is removed so that in case of depositing a layer, a wafer may be grown on a more suitable surface.

As above described, in accordance with the disclosed example, a tube cleaner is equipped within a loading chamber of the UHV-CVD, and it is possible to clean a device with in-situ.

A layer deposition described in FIG. 1 is carried out at a temperature of 550° C. to 800° C. and a process pressure is from mTorr to high Torr, and then thereby to adapt SiH4, Si2H6, H2 and various doping gas, such as PH3, B2H6 and AsH3 gases.

Figure 3:
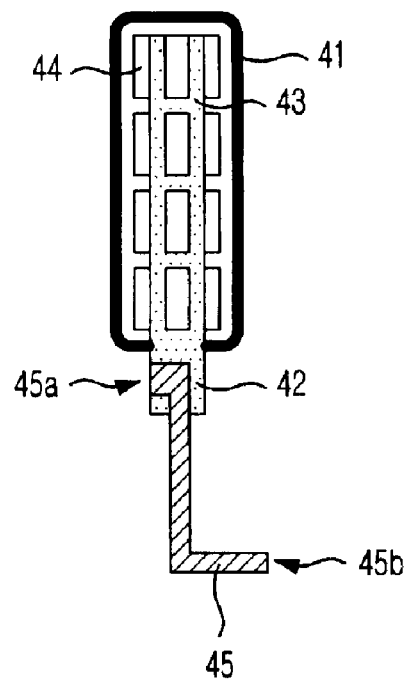
FIG. 3 is a diagram showing a first embodiment of a tube cleaner in FIG. 2.

FIG. 3 is a diagram showing a first embodiment of a tube cleaner in FIG. 2.

Referring to FIG. 3, there is described a long bar-type tube cleaner. The cleaner includes a cleaning tube 41, which is sealed and which may be made of quartz, and a connection unit 42 passing through a bottom portion of the cleaning tube 41.

A halogen lamp assembly 43 is provided on an internal surface of the cleaning tube 41 and connected to the connection 42, wherein the halogen lamp assembly is uniform.

A halogen lamp or lamps 44 in appropriate numbers are fixed in the halogen lamp assembly 43 to increase the maximum cleaning temperature to about 1300° C.

Figure 5:
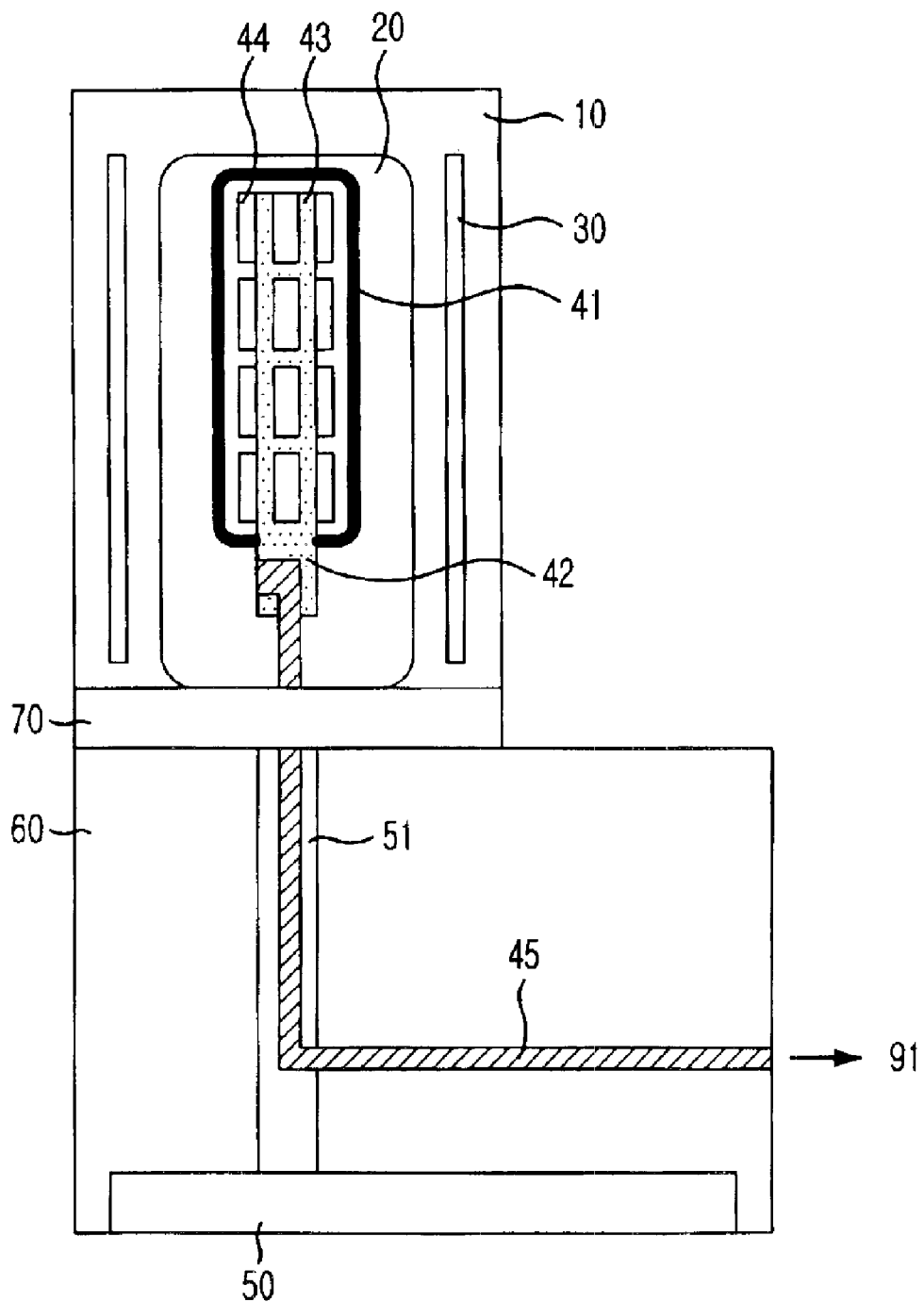
FIG. 5 is a diagram showing a long bar-type tube cleaner loaded within a quartz tube.
Figure 6:
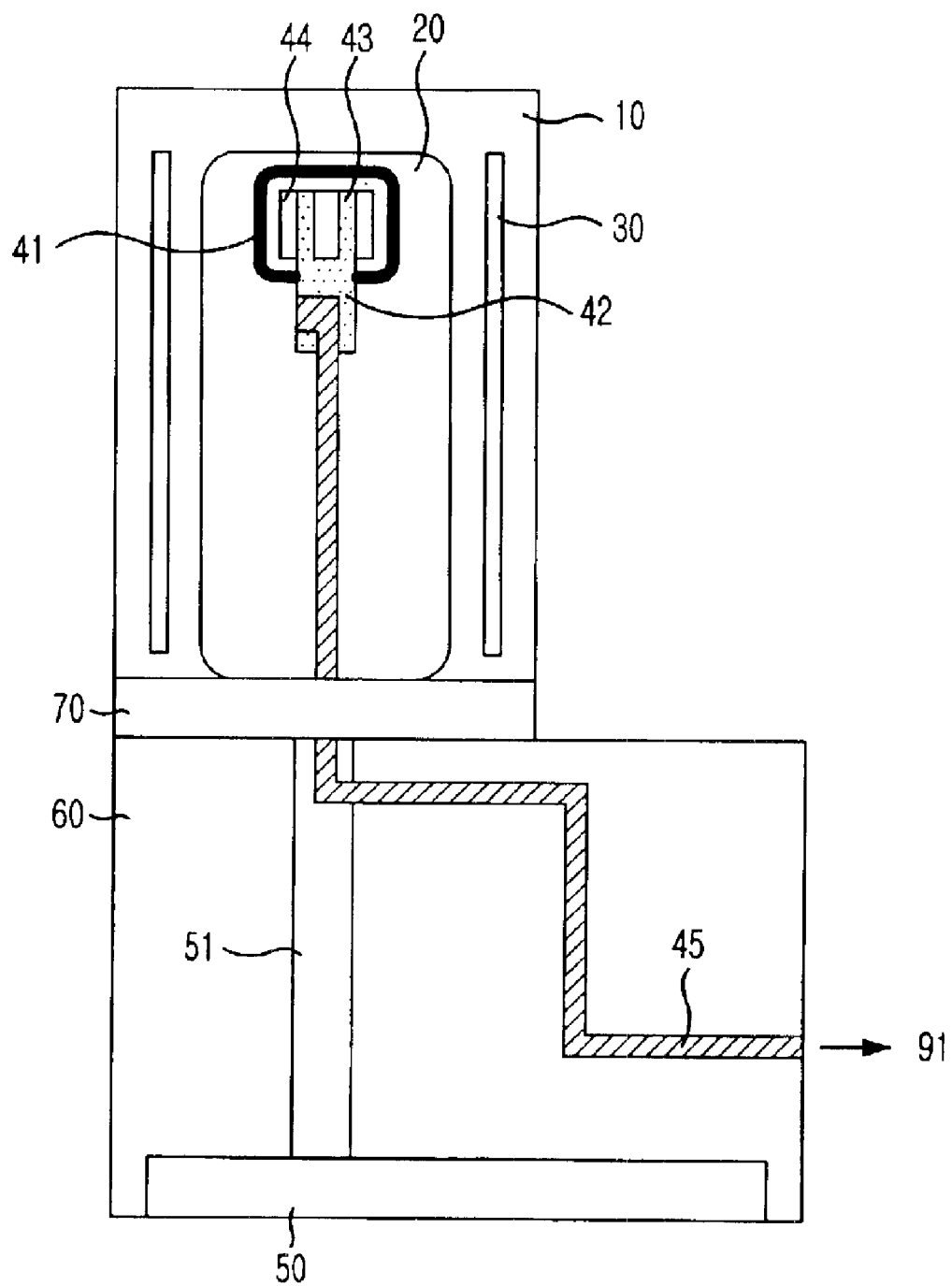
FIG. 6 is a diagram showing a short bar-type tube cleaner loaded within a quartz tube.

An exhaust tube 45 is provided in the connection unit 42 passing through the bottom portion of the cleaning tube 41. The exhaust tube 45 has an exit 45b, which is extended as much as a predetermined length, externally, by having an exit 45a passing through a part (an exposed part within a quartz tube after loading) and an internal part of the connection unit 42. The extension length of the exit 45b may be determined by the distance between the body of the exhaust tube 45 to the foreline 91 and the size of the loading chamber 60 through which the exhaust tube 45 passes, as shown in FIGS. 5 and 6.

The extended exit 45b has a flexibility to be connected to the foreline 91 by passing through the loading chamber 60 even though the cleaning tube 41 is loaded within the quartz tube 20.

Meanwhile, the connection unit 42 connected to the halogen lamp assembly 43 is connected to the elevator 50 so that it is possible to move a long bar-type tube cleaner within the quartz tube 20 from the loading chamber 60.

The exhaust tube 45 is a tube for directly exhausting a cleaning by-product of the quartz tube 20, and the by-product is directly exhausted to the rough pump 90 without passing the TMP 80. The exhaust tube 45 has the exit 45b, which is connected to the foreline 91 by passing the exposed exit 45 within the quartz tube 20 and the loading chamber, so the cleaning by-product may be exhausted to the rough pump 90 by passing the loading chamber 60 from the quartz tube 20.

By-product gases exhausted after cleaning have very strong corrosion characteristics, so if a by-product is directly exhausted to the TMP 80, it may deteriorate the TMP 80. For the above-mentioned reason, the exhaust tube 45 is comprised of materials having a strong corrosion-resistance and the exhaust tube 45 has flexibility because the exit 45b is fixed to the loading chamber 60 and may follow movement of the cleaning tube 41.

The tube cleaner shown in FIG. 3 modulates a size of the cleaning tube 41 and the halogen lamp assembly 43 so that an effective cleaning zone, which is heated and cleansed, corresponds to the whole portion of the quartz tube 20. The cleaning tube 41 and the halogen lamp assembly 43 are referred to as a long bar-type tube cleaner because they have formation of a long bar-type, and they are fixed within the quartz when cleaning the inside wall of the quartz tube 20.

Figure 4:
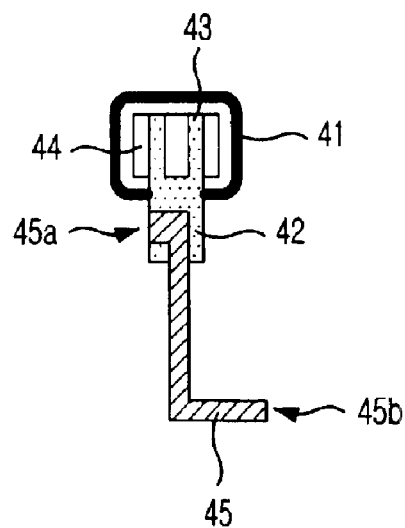
FIG. 4 is a diagram showing a second embodiment of a tube cleaner in FIG. 2.

FIG. 4 is a diagram showing a second embodiment of a tube cleaner in FIG. 2.

Referring to FIG. 4, there is described a short bar-type tube cleaner. The cleaner includes a cleaning tube 41, which is sealed and comprised of quartz, and a connection unit 42, which penetrates a bottom portion of the cleaning tube 41.

A halogen lamp assembly 43 is equipped at an internal surface of the cylindrical-type of cleaning tube 41 and connected to the connection 42, wherein the halogen lamp assembly 43 is uniformly arranged.

A halogen lamp 44 with appropriate numbers are fixed in the halogen lamp assembly 43 to increase a cleaning temperature to a maximum of about 1300° C.

An exhaust tube 45 is equipped in the connection unit 42 passing through a bottom portion of the cleaning tube 41. The exhaust tube 45 has an exit 45b, which is extended as much as a predetermined length, externally, by having an exit 45a that is penetrates a part (an exposed part within a quartz tube after loading) and an internal part of a connection unit 42.

The extended exit 45b has a flexibility to be connected to the foreline 91 by passing the loading chamber 60 even though the cleaning tube 41 is loaded within the quartz tube 20.

Meanwhile, the connection unit 42 connected to the halogen lamp assembly 43 is connected to an elevator so that it is possible to move a short bar-type tube cleaner within the quartz tube 20 from the loading chamber 60.

The exhaust tube 45 is a tube for directly exhausting a cleaning by-product of the quartz tube 20, and the by-product is directly exhausted to the rough pump 90 without passing the TMP 80. The exhaust tube 45 has the exit 45b, which is connected to the foreline 91 by passing the exposed exit 45 within the quartz tube 20 and the loading chamber, so the cleaning by-product may be exhausted to the rough pump 90 by passing the loading chamber 60 from the quartz tube 20.

By-product gases exhausted after cleaning have very strong corrosion characteristics, so if a by-product is directly exhausted to the TMP 80, it may deteriorate the TMP 80. For the above-mentioned reason, the exhausted tube 45 includes materials having a strong corrosion resistance and the exhausted tube 45 has flexibility because the exit 45b is fixed to the loading chamber 60 and can follow movement of the cleaning tube 41.

The tube cleaner shown in FIG. 3 modulates a size of the cleaning tube 41 and the halogen lamp assembly 43, so that an effective cleaning zone, which is heated and cleansed, corresponds to the whole portion of the quartz tube 20. The cleaning tube 41 and the halogen lamp assembly 43 are connected to an edge of the long bar-type connection unit 42, that is, they are arranged to have a size of 5 centimeters to 25 centimeters as an effective cleaning zone.

Besides, the tube cleaner shown in FIG. 4 has a smaller size of a halogen lamp assembly than that of the long bar-type tube cleaner in FIG. 3, so the cleaner moves within the quartz tube 20 and cleanses a deposition by-product generated inside the wall of the quartz tube 20.

The above-mentioned long bar-type tube cleaner and a short bar-type tube cleaner have a common feature of having a sealed cleaning tube comprised of quartz, but the cleaning tube, type and size of the halogen lamp assembly attaching the halogen lamp, and the cleaning method are different.

That is during an in-situ chamber cleaning processing, a long bar-type tube cleaner is fixed, but a short bar-type tube cleaner carries out a cleaning process by moving up and down.

Therefore, a long bar-type tube cleaner has an advantage capable of carrying out a cleaning process at one time for a short time, but has a disadvantage, of which a high load may be applied. Meanwhile, a short bar-type tube cleaner has an advantage of a high cleaning effect but it takes more time than that of a long bar-type tube cleaner.

When showing a silicon deposition using the UHV-CVD having a structure as shown in FIG. 1, after inserting the wafers 11 to the quartz tube 20 by elevating the wafers 11 using the elevator 50, which has a lift gear 51, valves equipped to the gas injection lines 12 are closed. Then, among vacuum pumps, the rough pump 90 and the TMP 80 are successively operated so that a pressure within the quartz tube 20 is decreased as much as a deposition pressure needed in the UHV-CVD.

After that, when a pressure within the quartz tube 20 has reached a suitable deposition pressure, a valve of a silicon source injection line is opened among the gas injection lines 12, to thereby inject a silicon source. At this time, the heater 30 is operated so that the wafers 11 are equally heated to a high temperature needed in a deposition.

When an injection of the wafers 11 are completed, a valve of reaction gas injection line, among the gas injection lines 20, is opened. Therefore, reaction gases needed in a silicon deposition are injected into the quartz tube 20 through corresponding gas injection lines 12, in a predetermined amount.

At this time, because the reaction gases are reacted with each other, silicon is deposited on a surface of the wafers 11, and a remnant gas and a reaction by-product are exhausted through the rough pump 90.

After completing silicon deposition using the above-mentioned method, the wafer having the deposited silicon goes down to the loading chamber 60 through the elevator 50, and a long bar- type tube cleaner or a short bar-type tube cleaner is loaded into the quartz tube 20 from the loading chamber 60. Next, a cleaning gas is injected into the quartz tube 20 to carry out a cleaning to remove by-products generated on the inside wall of the quartz tube 20.

At this time, a HCl gas is used as a cleaning gas because silicon by-products generated on the inside wall of the quartz tube 20, which is maintained at a high temperature of 9000° C. to 1300° C., may be easily removed by using the HCl gas. It is because a silicon etching characteristic of a halogen element, such as Cl, is very excellent.

For example, if a Cl gas is provided through the gas injection line 12 in a condition when the inside wall of the quartz tube 20 is heated over a temperature of 1200° C., a silicon layer over 5000 Å may be etched within one minute.

FIG. 5 is a diagram showing a long bar-type tube cleaner loaded within a quartz tube. Referring to FIG. 5, a method of a quartz tube cleaning using a long bar-type tube cleaner will be described.

A long bar-type tube cleaner moved to the elevator 50 having the corresponding elevating gear 51 is vertically loaded into the quartz tube 20, and power is supplied to the halogen lamp 44 so that a temperature of the inside wall of the quartz tube 20 becomes between about 900° C. to about 1300° C.

At this time, a cleaning gas including Cl is injected through a gas injection line (not shown) then, a cleaning process is carried out.

A flow condition of a cleaning gas may be as below:

Cl (0.5 slm~5.0 slm) and a hydrogen ($H_2$=5.0 slm~50.0 slm) are injected as a cleaning gas and a pressure of the quartz tube 20 is maintained in the range of about 5 Torr to about 300 Torr, and then an exhausted gas that is a cleaning by-product is exhausted to the rough pump 90 through the exhaust tube 45 and a foreline 91.

FIG. 6 is a diagram showing a short bar-type tube cleaner loaded within the quartz tube. Referring to FIG. 6, a method of a quartz tube cleaning using a short bar-type tube cleaner will be described.

A short bar-type tube cleaner is moved to the elevator 50 having the corresponding elevating gear 51 and is vertically loaded into the quartz tube 20, and power is supplied to the halogen lamp 44 so that a temperature of the inside wall of the quartz tube 20 is between about 900° C.~300° C.

At this time, a cleaning gas including C1 is injected through a gas injection line then, such that the cleaning process is carried out.

A flow condition of a cleaning gas is as below:

Cl (0.5 slm 5.0 slm) and a hydrogen ($H_2$=5.0 slm~50.0 slm) are injected as a cleaning gas and a pressure of the quartz tube 20 is maintained between about 5 Torr to about 300 Torr, and then an exhausted gas that is a cleaning by-product is exhausted to the rough pump 90 through the exhaust tube 45 and a foreline 91.

Meanwhile, different from a long bar-type tube cleaner, a short bar-type tube cleaner is not fixed within the quartz tube 20 and carries out a cleaning process by moving up and down.

Also, the short bar-type cleaner has a size of 5 centimeters to 25 centimeters of an effective clearing zone, so it carries out a cleaning operation by moving with a moderate speed. For example, if it takes one minute in removing a silicon layer at a thickness of 5000 Å, in case of a short-type tube cleaner having a length of 10 centimeters of the effective cleaning zone, it may be move at a speed of 10 cm/min.

As a result, a short bar-type tube cleaner effectively performs an in-situ cleaning to a quartz tube while requiring a minimum of power loading.

In the above-mentioned embodiments, there shows an example of a method for cleaning in-situ in case of cleaning a quartz tube of the UHV-CVD using a long bar-type or a short bar-type tube cleaner. Besides, a long bar-type or a short bar-type tube cleaner may be adapted in a chamber cleaning process of all the deposition devices, which use a quartz tube and a tube-type chamber.

Also, a long bar-type or a short bar-type tube cleaner may be used in all the deposition device layer except single crystal silicon, which is adapted in a semiconductor device, such as a nitride layer, an oxide layer and SiGe, etc., and in this case, only a proper usage of a gas to remove a generated by-product within a quartz tube is required.

The present invention may shorten manpower and time compared with an ex-situ cleaning, and a process condition is not changed because the present invention does not touch a quartz tube so, a process may be safely performed.

Also, an optional process monitoring time is reduced after cleaning a quartz tube so process productivity is increased, and the present invention increases applying capability of a good productivity having tube type deposition device, so an epitaxial wafer or an selective epitaxial growth application is advanced, thereby to increase a semiconductor device development and an economic condition.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A chamber cleaner, comprising:
   a sealed cleaning element;
   a connection tube passing through a side of the cleaning element;
   a lamp assembly connected to the connection tube and uniformly arranged in an inside surface of the cleaning element:
   the lamp assembly including a heat-source disposed within the lamp assembly; and
   an exhaust tube having an entrance passing through an outside portion of the connection tube, the outside portion exterior to the cleaning element, the exhaust tube further including an exit passing through an inside portion of the connection tube.

2. The chamber cleaner as recited in claim 1, wherein the cleaning element is a fixed-type or a portable-type.

3. The chamber cleaner as recited in claim 1, wherein the exhaust tube is flexible.

4. The chamber cleaner as recited in claim 1, wherein the cleaning element is quartz.

5. The chamber cleaner as recited in claim 1, wherein the heat-source is a halogen lamp heating at a temperature of 900 degrees C. to 1300 degrees C.

6. A chamber cleaner for use in a chamber of a deposition device and comprising:
   a lamp assembly means including a heat-source disposed within the lamp assembly means for controlling cleaning temperature;
   a connection means connected to the lamp assembly means for connecting the chamber cleaner to an elevator for moving the chamber cleaner; and
   an exhausting means coupled to the connection means and having a path for exhausting cleaning by-products.

7. The chamber cleaner as recited in claim 6, further comprising a sealing means for covering the lamp assembly means and a portion of the connection means that is not the exhausting means.

8. The chamber cleaner as recited in claim 7, wherein the chamber cleaner is fixed within the chamber during cleaning the inside wall of the chamber.

9. The chamber cleaner as recited in claim 8, wherein the exhausting means is a flexible tube.

10. The chamber cleaner as recited in claim 9, wherein the heat source is a halogen lamp heating at a temperature of about 900° C. to about 1300° C.

11. The chamber cleaner as recited in claim 10, wherein the sealing means is quartz.

12. The chamber cleaner as recited in claim 11, wherein the lamp assembly means is uniformly arranged in an inside surface of the sealing means.

13. The chamber cleaner as recited in claim 7, wherein the chamber cleaner moves up and down within the chamber during cleaning the inside of wall of the tube-type chamber.

14. The chamber cleaner as recited in claim 13, wherein the exhausting means is a flexible tube.

15. The chamber cleaner as recited in claim 14, wherein the sealing means is quartz.

16. The chamber cleaner as recited in claim 15, wherein the heat-source is a halogen lamp heating at a temperature of about 900° C. to about 1300° C.

* * * * *